United States Patent
Hong et al.

(10) Patent No.: US 10,373,762 B2
(45) Date of Patent: *Aug. 6, 2019

(54) MULTILAYER CERAMIC CAPACITOR AND BOARD HAVING THE SAME

(71) Applicant: SAMSUNG ELECTRO-MECHANICS CO., LTD., Suwon-si, Gyeonggi-do (KR)

(72) Inventors: Min Hee Hong, Suwon-si (KR); Chul Seung Lee, Suwon-si (KR); Won Seh Lee, Suwon-si (KR); Doo Young Kim, Suwon-si (KR); Chang Hoon Kim, Suwon-si (KR); Jae Yeol Choi, Suwon-si (KR); Hyeun Tea Yoon, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/825,857

(22) Filed: Nov. 29, 2017

(65) Prior Publication Data

US 2018/0082790 A1  Mar. 22, 2018

Related U.S. Application Data

(63) Continuation of application No. 14/877,876, filed on Oct. 7, 2015, now Pat. No. 9,859,058.

(30) Foreign Application Priority Data

Jan. 6, 2015 (KR) .................. 10-2015-0001038

(51) Int. Cl.
H05K 1/16 (2006.01)
H01G 4/30 (2006.01)
(Continued)

(52) U.S. Cl.
CPC ............ *H01G 4/30* (2013.01); *H01G 4/0085* (2013.01); *H01G 4/1227* (2013.01);
(Continued)

(58) Field of Classification Search
CPC ...... H01G 4/30; H01G 4/0085; H01G 4/1227; H01G 4/232; H05K 3/3442
(Continued)

(56) References Cited

U.S. PATENT DOCUMENTS 9,025,310 B2  5/2015  Kim
9,042,081 B2  5/2015  Kim
(Continued)

FOREIGN PATENT DOCUMENTS

CN  103903856 A  7/2014
CN  104103419 A  10/2014
(Continued)

OTHER PUBLICATIONS

Non-Final Office Action issued in corresponding parent U.S. Appl. No. 14/877,876, dated Apr. 10, 2017.
(Continued)

*Primary Examiner* — Tremesha S Willis
(74) *Attorney, Agent, or Firm* — Morgan Lewis & Bockius LLP

(57) ABSTRACT

A multilayer ceramic capacitor includes a ceramic body including an active portion including dielectric layers and internal electrodes that are alternately stacked and a margin portion disposed on outer surfaces of the active portion; and external electrodes disposed on outer surfaces of the ceramic body. The margin portion includes an inner half adjacent to the active portion and an outer half adjacent to the edge of the ceramic body, and a porosity of the inner half is greater than a porosity of the outer half.

8 Claims, 5 Drawing Sheets

(51) Int. Cl.
*H01G 4/008* (2006.01)
*H01G 4/12* (2006.01)
*H01G 4/232* (2006.01)
*H05K 3/34* (2006.01)

(52) U.S. Cl.
CPC ........... *H01G 4/232* (2013.01); *H05K 3/3442* (2013.01); *H05K 2201/10015* (2013.01); *H05K 2201/10636* (2013.01); *Y02P 70/611* (2015.11)

(58) Field of Classification Search
USPC ....................................................... 174/260
See application file for complete search history.

(56) References Cited

U.S. PATENT DOCUMENTS

| 2011/0056735 | A1 | 3/2011 | Lee et al. |
| 2014/0177134 | A1 | 6/2014 | Awata et al. |
| 2014/0301012 | A1 | 10/2014 | Kim |
| 2014/0301015 | A1 | 10/2014 | Kim |

FOREIGN PATENT DOCUMENTS

| CN | 104103423 A | 10/2014 |
| JP | 2003-309039 A | 10/2003 |
| JP | 2005-159056 A | 6/2005 |
| JP | 2014-204116 A | 10/2014 |
| KR | 10-1069989 B1 | 10/2011 |

OTHER PUBLICATIONS

Non-Final Office Action issued in corresponding parent U.S. Appl. No. 14/877,876, dated Jul. 18, 2016.
Final Office Action issued in corresponding parent U.S. Appl. No. 14/877,876, dated Nov. 18, 2016.
Notice of Allowance issued in corresponding parent U.S. Appl. No. 14/877,876, dated Sep. 1, 2017.
Chinese Office Action issued in corresponding Chinese Patent Application No. 201510691571.9, dated Jul. 3, 2018, with English Translation.

X – X'

MULTILAYER CERAMIC CAPACITOR AND BOARD HAVING THE SAME

CROSS-REFERENCE TO RELATED APPLICATION

This application is a continuation of U.S. patent application Ser. No. 14/877,876, filed on Oct. 7, 2015, which claims the benefit of priority to Korean Patent Application No. 10-2015-0001038, filed on Jan. 6, 2015 with the Korean Intellectual Property Office, the entirety of which are incorporated herein by reference.

BACKGROUND

The present disclosure relates to a multilayer ceramic capacitor and a board having the same.

Generally, electronic components using a ceramic material, such as capacitors, inductors, piezoelectric elements, varistors, thermistors, and the like, include a ceramic body formed of a ceramic material, internal electrodes formed in the ceramic body, and external electrodes formed on surfaces of the ceramic body so as to be connected to the internal electrode layers.

Among the ceramic electronic components, a multilayer ceramic capacitor is configured to include a plurality of multilayer dielectric layers, internal electrode layers disposed to face each other, having the dielectric layer interposed therebetween, and external electrodes electrically connected to the internal electrode layers.

Multilayer ceramic capacitors have been widely used as components of computers, mobile communications devices such as personal digital assistants (PDAs), mobile phones, and the like, due to advantages such as small size, high capacitance, ease of mounting, and the like.

In accordance with the improvement in performance of electric or electronic devices and thinness and lightness of the electric or electronic devices, demand for small-sized, high-performance, and inexpensive electronic components has increased.

Generally, a method of manufacturing a multilayer ceramic capacitor is as follows. Ceramic green sheets are manufactured, and a conductive paste is printed on the ceramic green sheets to form an internal electrode film.

Several tens to several hundreds of ceramic green sheets on which the internal electrode films are formed are stacked to overlap each other, thereby forming a green ceramic multilayer body.

Then, the green ceramic multilayer body is compressed at a high temperature and high pressure to form a hard green ceramic multilayer body, and a cutting process is performed on the hard green ceramic multilayer body to manufacture a green chip. Then, the green chip is plasticized, sintered, and polished, and external electrodes are formed to complete the multilayer ceramic capacitor.

Generally, internal electrodes formed of metal more easily contract and expand relative to the dielectric layers formed of ceramic material, and stress due to the difference between coefficients of thermal expansion acts on the ceramic multilayer body, and thus cracks may occur in the ceramic multilayer body.

Meanwhile, the reliability of the multilayer ceramic capacitor may be decreased due to permeation of a plating solution in a process of thinning the dielectric layers and internal electrodes of the ceramic body.

In accordance with the trend towards miniaturization and capacitance increase of the multilayer ceramic capacitor, the ceramic multilayer body has been made thinner and with increased number of layers. As a result, crack occurrence has increased in frequency and, due to permeation of the plating solution, the reliability of the multilayer ceramic capacitor has decreased. Therefore, the importance of solving these problems has increased.

SUMMARY

One aspect of the present disclosure provides a multilayer ceramic capacitor and a board having the same.

According to one aspect of the present disclosure, a multilayer ceramic capacitor comprises a ceramic body including an active portion including dielectric layers and internal electrodes that are alternately stacked and a margin portion disposed on outer surfaces of the active portion; and external electrodes disposed on outer surfaces of the ceramic body, wherein the margin portion includes an inner half adjacent to the active portion and an outer half adjacent to the edge of the ceramic body, and a porosity of the inner half is greater than a porosity of the outer half.

The porosity of the inner half may be 0.06% to 2.0%, and the porosity of the outer half may be 0.05% or less.

A size of each pore in the inner half may be 0.05 µm to 0.1 µm.

A size of each pore in the outer half may be 0.015 µm to 0.03 µm.

The margin portions disposed on upper and lower surfaces of the active portion may have dielectric grains of the inner half and the outer half that are different from each other.

According to another aspect of the present disclosure, a board having a multilayer ceramic capacitor comprises a printed circuit board on which a plurality of electrode pads are disposed; and the multilayer ceramic capacitor installed on the printed circuit board, wherein the multilayer ceramic capacitor includes a ceramic body including an active portion including dielectric layers and internal electrodes that are alternately stacked and a margin portion disposed on outer surfaces of the active portion, and external electrodes disposed on outer surfaces of the ceramic body, and the margin portion includes an inner half adjacent to the active portion and an outer half adjacent to the edge of the ceramic body, and a porosity of the inner half is greater than a porosity of the outer half.

BRIEF DESCRIPTION OF DRAWINGS

The above and other aspects, features and advantages of the present disclosure will be more clearly understood from the following detailed description taken in conjunction with the accompanying drawings.

DETAILED DESCRIPTION

Figure 1:
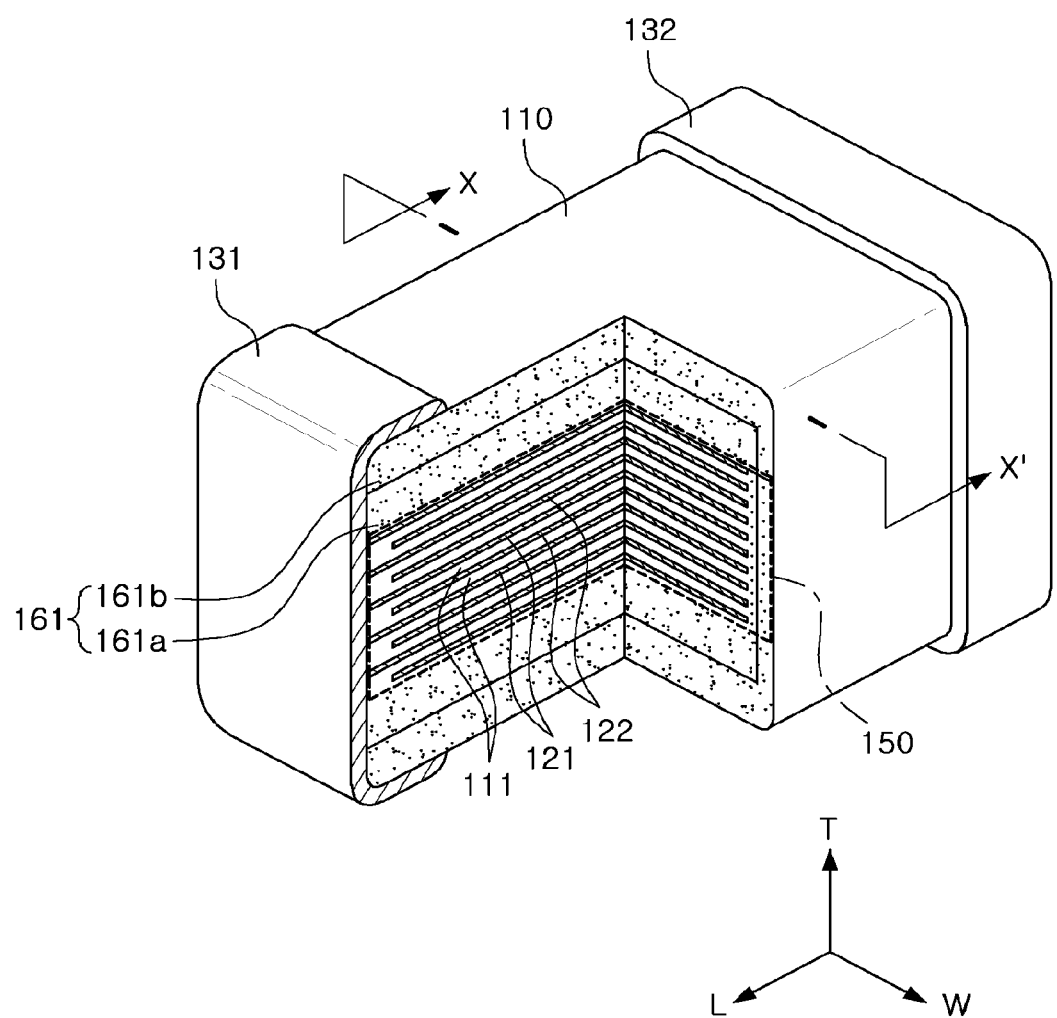
FIG. 1 is a partially cut-away perspective view of a multilayer ceramic capacitor according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Capacitor

FIG. 1 is a partially cut-away perspective view of a multilayer ceramic capacitor according to an exemplary embodiment.

Figure 2:
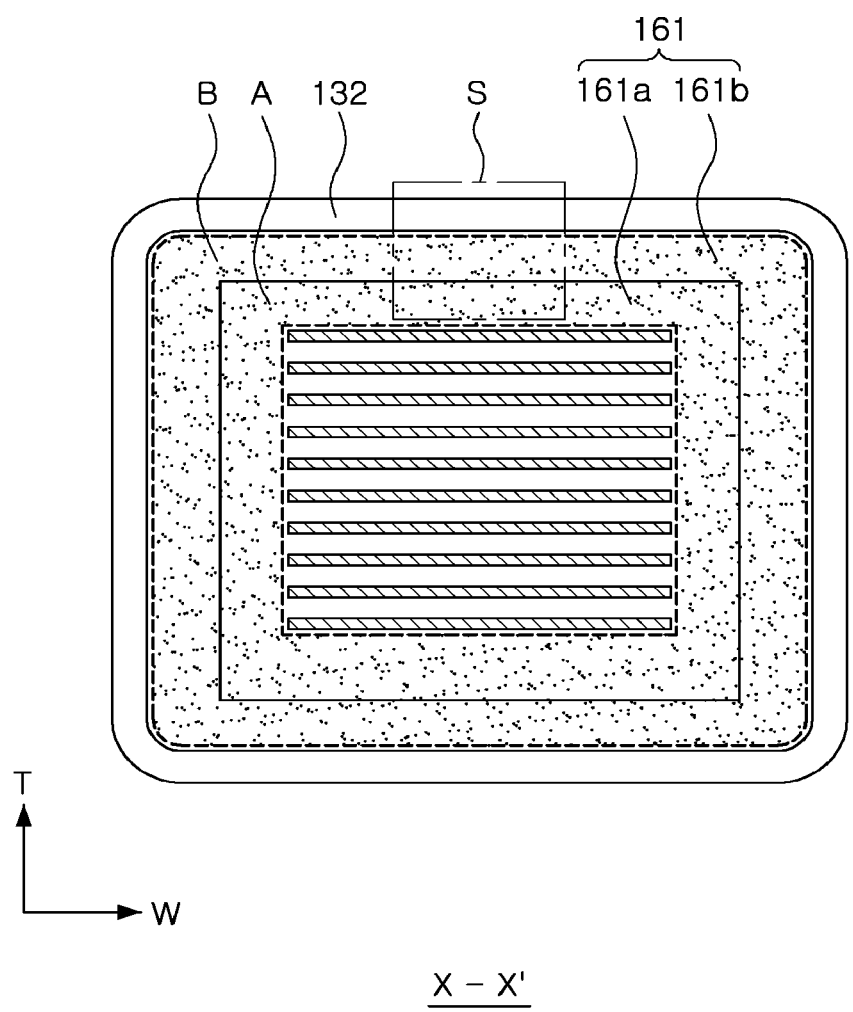
FIG. 2 is a cross-sectional view taken along line X-X' of FIG. 1.

FIG. 2 is a cross-sectional view taken along line X-X' of FIG. 1.

Referring to FIG. 1, a multilayer ceramic capacitor 100, according to an exemplary embodiment, may include a ceramic body 110 and external electrodes 131 and 132.

According to an exemplary embodiment, "T," "L," and "W" directions illustrated in FIGS. 1 and 2 refer to a thickness direction, a length direction, and a width direction of the ceramic body 110, respectively.

The thickness "T" direction refers to a direction in which internal electrodes and dielectric layers are stacked.

Referring to FIGS. 1 and 2, the ceramic body 110 may have first and second side surfaces opposing each other in the width direction, first and second end surfaces opposing each other in the length direction, and first and second main surfaces opposing each other in the thickness direction. A shape of the ceramic body 110 is not particularly limited. For example, the ceramic body 110 may not have a hexahedral shape having a completely straight line, but may have an approximately hexahedral shape.

The ceramic body 110 may include an active portion 150 and a margin portion 161 formed on upper and lower surfaces and side surfaces of the active portion 150 and formed of ceramic.

The active portion 150 may include a plurality of dielectric layers 111 and a plurality of internal electrodes 121 and 122. According to an exemplary embodiment, as illustrated in FIG. 2, the dielectric layers 111 and the internal electrodes 121 and 122 may be stacked in the thickness T direction of the ceramic body.

According to an exemplary embodiment, the active portion 150 may be formed by alternately stacking the internal electrodes 121 and 122 and the dielectric layers 111.

The margin portion 161 disposed on the upper and lower surfaces of the active portion 150 may be called a cover part or a protecting part.

In an exemplary embodiment, it may be understood that an upper surface and a lower surface of the ceramic body are not separately distinguished from each other in the ceramic body unless specifically marked, but are one surface and the other surface of the ceramic body opposing each other in the thickness direction, respectively, and an upper portion and a lower portion of the ceramic body are regions between a first main surface and a second main surface of the ceramic body opposing each other in the thickness direction and the active portion 150, respectively.

The dielectric layer 111 may contain a high-k ceramic material, such as barium titanate ($BaTiO_3$) based powders or strontium titanate ($SrTiO_3$) based powders. However, a material of the dielectric layer 111 is not limited thereto as long as sufficient capacitance may be obtained.

In addition, the dielectric layer 111 may further contain ceramic additives, organic solvents, plasticizers, binders, dispersants, and the like, if necessary, in addition to the ceramic powder.

The ceramic additive may be a transition metal oxide or carbide, a rare earth element, magnesium (Mg), aluminum (Al), or the like, but is not limited thereto.

Here, a thickness of the dielectric layer 111 may be arbitrarily altered depending on a capacitance design of the multilayer ceramic capacitor 100.

The internal electrodes may include first and second internal electrodes 121 and 122. The first and second internal electrodes 121 and 122 may be alternately disposed with each of the dielectric layers 111 interposed therebetween. The first and second internal electrodes 121 and 122 may be electrically insulated from each other by the dielectric layers 111 disposed therebetween.

The first and second internal electrodes 121 and 122 to which voltages having different polarities are applied, respectively, may be, for example, formed by printing a conductive paste containing a conductive metal at a predetermined thickness on one surface of the dielectric layers 111. The first internal electrodes 121 may be exposed through the first end surface of the ceramic body, and the second internal electrodes 122 may be exposed through the second end surface of the ceramic body.

The first and second internal electrodes 121 and 122 may be electrically connected to external electrodes 131 and 132 through portions exposed to outer surfaces of the ceramic body 110, respectively.

Therefore, when voltages are applied to the external electrodes 131 and 132, electric charges may accumulate between the first and second internal electrodes 121 and 122 facing each other. In this case, capacitance of the multilayer ceramic capacitor 100 may be in proportion to an area of a region in which the first and second internal electrodes 121 and 122 overlap each other in the active portion 150.

In addition, the conductive metal contained in the conductive paste forming the first and second internal electrodes 121 and 122 may be nickel (Ni), copper (Cu), palladium (Pd), or an alloy thereof, but is not limited thereto.

The external electrodes 131 and 132 may be disposed on the first and second end surfaces of the ceramic body, respectively, and may be connected to the first and second internal electrodes 121 and 122, respectively. The external electrodes 131 and 132 may include a first external electrode 131 and a second external electrode 132. The first external electrode 131 may be connected to the first internal electrodes 121 and the second external electrode 132 may be connected to the second internal electrodes 122.

The cover part or the protecting part, the margin portion 161 disposed on the upper and lower surfaces of the active portion 150, may be formed by stacking a plurality of dielectric layers on which internal electrodes are not disposed. In this case, the dielectric layers may be formed of the same material as that of the dielectric layers configuring the active portion 150.

Alternatively, the dielectric layers configuring the cover part or the protecting part may be formed of a material different from that of the dielectric layers of the active portion 150 in order to improve protection efficiency of the active portion 150.

In the margin portion 161 disposed on the upper and lower surfaces of the active portion 150, among the margin portions, sizes of dielectric grains of a margin portion region 161a adjacent to the active portion 150 and a margin portion region 161b adjacent to an edge of the ceramic body 110 may be different from each other.

As described above, the sizes of the dielectric grains of the margin portion region 161a adjacent to the active portion 150 and the margin portion region 161b adjacent to the edge of the ceramic body 110 may be adjusted to be different from each other to adjust porosities of respective regions, and thus external impacts such as thermal impact, electrolyte impact, or the like, may be alleviated, and permeation of moisture or a plating solution may be prevented, whereby reliability of the multilayer ceramic capacitor may be improved.

According to an exemplary embodiment, for example, when a region of the margin portion 161 between an edge of the active portion 150 and the edge of the ceramic body 110 is bisected, porosity of the bisected region, for example, the margin portion region 161a adjacent to the active portion 150 may be greater than that of the bisected region, for example, the margin portion region 161b adjacent to the edge of the ceramic body 110.

Generally, a coefficient of thermal expansion of the dielectric layer formed of a ceramic material may be about 8 to $9 \times 10^{-6}/°$ C., and a coefficient of thermal expansion of the internal electrode formed of a metal such as nickel, or the like, may be $13 \times 10^{-6}/°$ C.

In a sintering process for manufacturing the multilayer ceramic capacitor, or when the multilayer ceramic capacitor is mounted on a printed circuit board, thermal impact may be applied to the multilayer ceramic capacitor.

The thermal impact may be concentrated on the dielectric layers having a relatively small coefficient of thermal expansion.

Relatively greatest thermal expansion stress due to thermal impact may act on a boundary between the active portion and the margin portion, as described above.

Cracks may be generated in the multilayer ceramic capacitor due to the thermal expansion stress as described above.

Meanwhile, reliability of the multilayer ceramic capacitor may be decreased due to permeation of a plating solution in a process of thinning the dielectric layers and the internal electrodes of the ceramic body.

According to an exemplary embodiment, for example, when the region between the edge of the active portion 150 and the edge of the ceramic body 110 is bisected, the porosity of the margin portion region 161a adjacent to the active portion 150 may be adjusted to be greater than that of the margin portion region 161b adjacent to the edge of the ceramic body 110, and thus external impacts such as thermal impact, electrolyte impact, or the like, may be alleviated, whereby a multilayer ceramic capacitor having high reliability and high capacitance may be implemented.

For instance, according to an exemplary embodiment, the porosities of the regions obtained by bisecting the margin portion 161 formed on the upper and lower surfaces and the side surfaces of the active portion 150 of the ceramic body 110 and formed of ceramic may be adjusted to decrease the occurrence of cracks and prevent a decrease in the reliability of the multilayer ceramic capacitor due to permeation of the plating solution.

A method of adjusting the porosity of the margin portion region 161a adjacent to the active portion 150 and the porosity of the margin portion region 161b adjacent to the edge of the ceramic body 110 is not particularly limited, but may be implemented, for example, by adjusting a hydrogen concentration for each heat treatment section in a process of sintering the ceramic body.

Alternatively, the method of adjusting the porosity of the margin portion region 161a adjacent to the active portion 150 and the porosity of the margin portion region 161b adjacent to the edge of the ceramic body 110 may also be implemented by adjusting a content of glass added to a ceramic paste configuring the dielectric layer.

The porosity of the margin portion region 161a adjacent to the active portion 150 and the porosity of the margin portion region 161b adjacent to the edge of the ceramic body 110 may be defined as ratios of areas of pores to areas A and B of the respective margin portion regions 161a and 161b.

The porosity of the margin portion region 161a adjacent to the active portion 150 and the porosity of the margin portion region 161b adjacent to the edge of the ceramic body 110 may be measured from an image of a cross section of the ceramic body 110 in a width-thickness (W-T) direction, scanned by a scanning electron microscope (SEM), as illustrated in FIG. 2.

For example, as illustrated in FIG. 2, the porosities of the respective margin portion regions 161a and 161b may be measured from the image of the cross section of the ceramic body 110 in the width-thickness (W-T) direction, scanned by the SEM.

Figure 3:
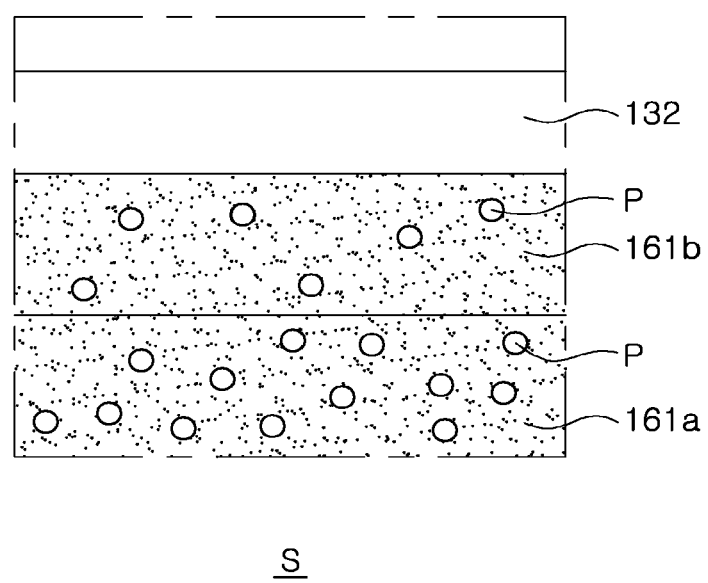
FIG. 3 is an enlarged view of region S of FIG. 2.

FIG. 3 is an enlarged view of region S of FIG. 2.

Referring to FIG. 3, the porosity of the margin portion region 161a adjacent to the active portion 150 may be 0.06% to 2.0%, and the porosity of the margin portion region 161b adjacent to the edge of the ceramic body 110 may be 0.05% or less.

The porosity of the margin portion region 161a adjacent to the active portion 150 may be adjusted to be 0.06% to 2.0%, and thus a margin portion region positioned in the vicinity of the interface between the active portion 150 and the margin portion 161 has a high porosity to act like a sponge. Therefore, the margin portion region positioned in the vicinity of the interface between the active portion 150 and the margin portion 161 may alleviate external impacts such as thermal impact, electrolyte impact, or the like, and thus a crack occurrence rate may be decreased.

In a case in which the porosity of the margin portion region 161a adjacent to the active portion 150 is less than 0.06%, stress is not absorbed, and thus thermal impact and sintering cracks may be generated.

In a case in which the porosity of the margin portion region 161a adjacent to the active portion 150 exceeds 2.0%, moisture resistance and strength of the ceramic body may be decreased.

Meanwhile, the porosity of the margin portion region 161b adjacent to the edge of the ceramic body 110 may be adjusted to be 0.05% or less, and thus a margin portion region adjacent externally may have a low porosity to prevent a decrease in the reliability of the multilayer ceramic capacitor due to permeation of moisture and a plating solution.

When the porosity of the margin portion region 161b adjacent to the edge of the ceramic body 110 exceeds 0.05%, an excessive number of pores may be present on a surface, such that the reliability of the multilayer ceramic capacitor may be decreased due to moisture and the plating solution in a high-temperature moisture resistance environment.

According to an exemplary embodiment, a size of each of pores P in the margin portion region 161a adjacent to the active portion 150 may be 0.05 μm to 0.1 μm.

The size of each of the pores P in the margin portion region 161a adjacent to the active portion 150 may be adjusted to be 0.05 µm to 0.1 µm to alleviate external impacts such as thermal impact, electrolyte impact, or the like, and thus a crack occurrence rate may be decreased.

When the size of each of the pores P in the margin portion region 161a adjacent to the active portion 150 is less than 0.05 µm, stress is not absorbed, and thus thermal impact and sintering cracks may be generated.

When the size of each of the pores P in the margin portion region 161a adjacent to the active portion 150 exceeds 0.1 µm, moisture resistance and strength of the ceramic body may be decreased.

Meanwhile, a size of each of pores P in the margin portion region 161b adjacent to the edge of the ceramic body 110 may be 0.015 µm to 0.03 µm.

The size of each of the pores P in the margin portion region 161b adjacent to the edge of the ceramic body 110 may be adjusted to be 0.015 µm to 0.03 µm to alleviate external impacts such as thermal impact, electrolyte impact, or the like, and thus a crack occurrence rate may be decreased.

When the size of each of the pores P in the margin portion region 161b adjacent to the edge of the ceramic body 110 is less than 0.015 µm, stress is not absorbed, and thus thermal impact and sintering cracks may be generated.

When the size of each of the pores P in the margin portion region 161b adjacent to the edge of the ceramic body 110 exceeds 0.03 µm, moisture resistance and strength of the ceramic body may be decreased.

Next, a method of manufacturing a multilayer ceramic capacitor according to an exemplary embodiment in the present disclosure will be described.

First, a plurality of ceramic green sheets that are to be stacked in the active portion may be prepared.

The ceramic green sheets may be manufactured by mixing ceramic particles, a binder, and a solvent with each other to prepare a slurry and manufacturing the slurry in a sheet shape having a thickness of several micrometers by a doctor blade method.

Next, internal electrode pastes may be applied to surfaces of the ceramic green sheets to form first and second internal electrode patterns.

The first and second internal electrode patterns may be formed by a screen printing method.

The internal electrode pastes may be prepared in a paste form by dispersing powders formed of Ni or an Ni alloy in an organic binder or an organic solvent.

The Ni alloy may contain Mn, Cr, Co, or Al together with Ni.

The organic binder may be a binder known in the art, such as a cellulose based resin, an epoxy resin, an aryl resin, an acrylic resin, a phenol-formaldehyde resin, an unsaturated polyester resin, a polycarbonate resin, a polyamide resin, a polyimide resin, an alkyd resin, rosin ester, or the like, but is not limited thereto.

In addition, the organic solvent may be a solvent known in the art, such as butyl carbitol, butyl carbitol acetate, turpentine oil, α-terpineol, ethyl cellosolve, butyl phthalate, or the like, but is not limited thereto.

Next, the ceramic green sheets on which the first and second internal electrode patterns are formed may be stacked and pressed in a stacked direction to compress the stacked ceramic green sheets and the internal electrode pastes.

As a result, the active portion in which the ceramic green sheets and the internal electrode pastes are alternately stacked may be prepared.

Next, a plurality of ceramic green sheets that are to be stacked on the upper and lower surfaces of the active portion may be prepared.

The ceramic green sheet may be manufactured by mixing ceramic particles, an organic binder, and a solvent with each other to prepare a slurry and manufacturing the slurry in a sheet shape having a thickness of several micrometers by a doctor blade method.

The ceramic green sheets may be stacked on the active portion to form the margin portions, which are protective layers.

Sizes of pores present in respective regions provided by bisecting the margin portion and porosities of the respective regions may be adjusted by adjusting a content of the ceramic particles, and a kind and an amount of the organic binder or adjusting a concentration of hydrogen for each heat treatment section at the time of performing sintering.

An average particle size of the ceramic particles may be 0.1 µm to 0.3 µm, and a content of the ceramic particles may be 15% to 40%.

Next, a ceramic multilayer body may be cut per region corresponding to one capacitor to thereby be manufactured in a chip form.

Here, the ceramic multilayer body may be cut so that one ends of the first and second internal electrode patterns are alternately exposed through side surfaces.

Then, the multilayer body manufactured in the chip form may be sintered at a temperature of, for example, about 1200° C. to manufacture a ceramic sintered body.

Here, sizes of pores in the margin portions disposed on the upper and lower surfaces and the side surfaces of the active portion in the cross section of the ceramic body in the width-thickness direction and porosities of the margin portions may be adjusted by adjusting the concentration of hydrogen for each heat treatment section.

In the regions provided by bisecting the margin portions disposed on the upper and lower surfaces and the side surfaces of the active portion, the porosity of the bisected regions adjacent to the active portion may be adjusted to be greater than that of the bisected regions adjacent to the edge of the ceramic body, and thus, a difference in stress generated when the internal electrodes are thermally expanded may be alleviated and permeation of moisture or a plating solution may be prevented.

Next, the first and second external electrodes may be formed to cover the end surfaces of the ceramic body and be electrically connected to the first and second internal electrodes exposed to the end surfaces of the ceramic body, respectively.

Then, a plating process using nickel, tin, or the like, may be performed on surfaces of the external electrodes.

Board Having Multilayer Ceramic Capacitor

Figure 4:
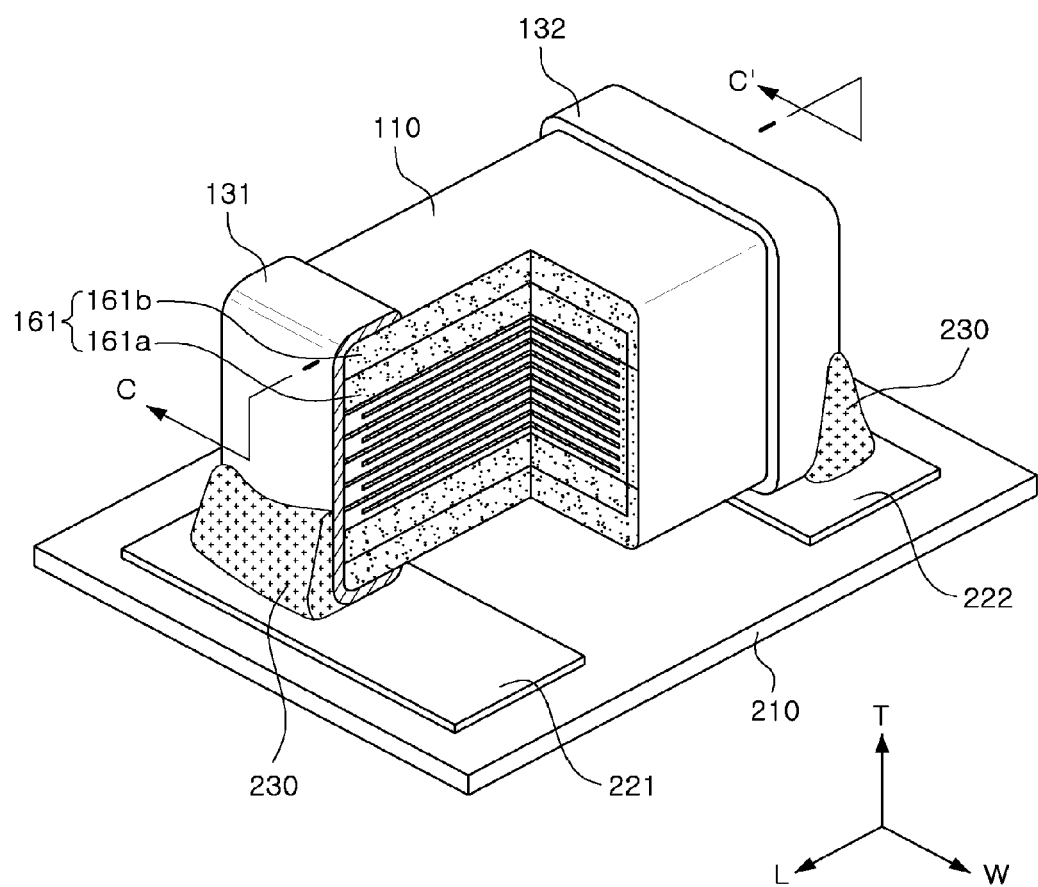
FIG. 4, which is a perspective view schematically illustrating a board having a multilayer ceramic capacitor according to another exemplary embodiment in the present disclosure, is a partially cut-away view of the multilayer ceramic capacitor.

FIG. 4, which is a perspective view of a board having a multilayer ceramic capacitor according to another exemplary embodiment, is a partially cut-away view of the multilayer ceramic capacitor.

Figure 5:
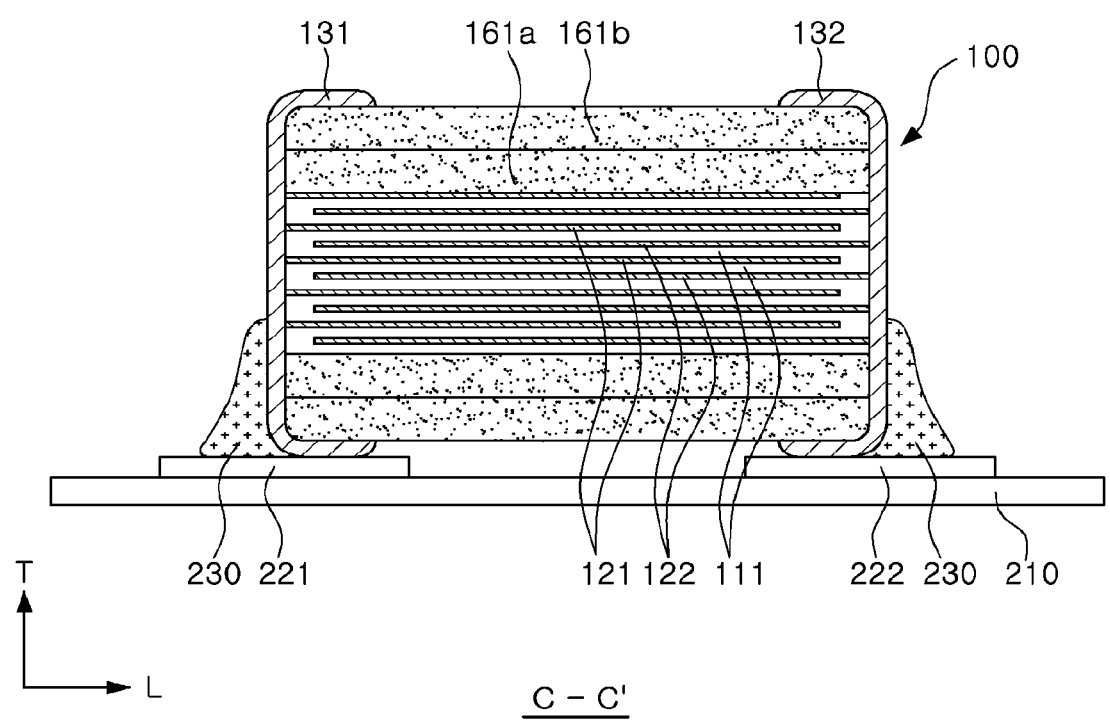
FIG. 5 is a cross-sectional view taken along line C-C' of FIG. 4.

FIG. 5 is a cross-sectional view taken along line C-C' of FIG. 4.

Referring to FIGS. 4 and 5, a board 200 having a multilayer ceramic capacitor according to an exemplary embodiment may include the multilayer ceramic capacitor 100 and a printed circuit board 210 on which the multilayer ceramic capacitor 100 is mounted.

The printed circuit board 210 may include electrode pads 221 and 222 formed on an upper surface thereof.

The multilayer ceramic capacitor 100 may be the multilayer ceramic capacitor according to an exemplary embodiment. Therefore, hereinafter, a detailed description of the multilayer ceramic capacitor 100 will be omitted in order to avoid an overlapping description.

The electrode pads 221 and 222 may be first and second electrode pads 221 and 222 connected to the first and second external electrodes 131 and 132 of the multilayer ceramic capacitor 100, respectively.

Here, the first and second external electrodes 131 and 132 of the multilayer ceramic capacitor 100 may be electrically connected to the printed circuit board 210 by solders 230 in a state in which they are positioned on the first and second electrode pads 221 and 222, respectively, to contact the first and second electrode pads 221 and 222, respectively.

As set forth above, according to an exemplary embodiment, in the multilayer ceramic capacitor, the porosities of the margin portions formed on the upper and lower surfaces and the side surfaces of the active portion and formed of ceramic may be adjusted to alleviate external impacts such as thermal impact, electrolyte impact, or the like, whereby a multilayer ceramic capacitor having high reliability and a high capacitance may be implemented.

For instance, according to an exemplary embodiment, the porosity of respective regions provided by bisecting the margin portions formed on the upper and lower surfaces and the side surfaces of the active portion and formed of ceramic may be adjusted to thereby decrease the occurrence of cracks and prevent the decrease in the reliability of the multilayer ceramic capacitor due to permeation of the plating solution.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:
   a ceramic body including an active portion including dielectric layers and internal electrodes that are alternately stacked in a thickness direction and a margin portion disposed on outer surfaces of the active portion; and
   external electrodes disposed on outer surfaces of the ceramic body,
   wherein the margin portion includes an inner half adjacent to the active portion and an outer half adjacent to an edge of the ceramic body, and a porosity of the inner half is greater than a porosity of the outer half, and the porosity of the inner half is 0.06% to 2.0%, and the porosity of the outer half is 0.05% or less, and
   the margin portion covers upper, lower and side surfaces of the active portion.

2. The multilayer ceramic capacitor of claim 1, wherein a size of each pore in the inner half is 0.05 μm to 0.1 μm.

3. The multilayer ceramic capacitor of claim 1, wherein a size of each pore in the outer half is 0.015 μm to 0.03 μm.

4. The multilayer ceramic capacitor of claim 1, wherein in margin portions disposed on upper and lower surfaces of the active portion in the thickness direction, sizes of dielectric grains of the inner half and the outer half are different from each other.

5. A board having a multilayer ceramic capacitor, comprising:
   a printed circuit board on which a plurality of electrode pads are disposed; and
   the multilayer ceramic capacitor installed on the printed circuit board,
   wherein the multilayer ceramic capacitor includes a ceramic body including an active portion including dielectric layers and internal electrodes that are alternately stacked in a thickness direction and a margin portion disposed on outer surfaces of the active portion, and external electrodes disposed on outer surfaces of the ceramic body,
   the margin portion includes an inner half adjacent to the active portion and an outer half adjacent to an edge of the ceramic body, and a porosity of the inner half is greater than a porosity of the outer half, and the porosity of the inner half is 0.06% to 2.0%, and the porosity of the outer half is 0.05% or less, and
   the margin portion covers upper, lower and side surfaces of the active portion.

6. The board having a multilayer ceramic capacitor of claim 5, wherein a size of each pore in the inner half is 0.05 μm to 0.1 μm.

7. The board having a multilayer ceramic capacitor of claim 5, wherein a size of each pore in the outer half is 0.015 μm to 0.03 μm.

8. The board having a multilayer ceramic capacitor of claim 6, wherein in margin portions disposed on upper and lower surfaces of the active portion in the thickness direction, sizes of dielectric grains of the inner half and the outer half are different from each other.

* * * * *